US010678145B2

(12) United States Patent
Polo et al.

(10) Patent No.: US 10,678,145 B2
(45) Date of Patent: Jun. 9, 2020

(54) RADIATION RECEIVING SYSTEM

(71) Applicant: ASML Netherlands B.V., Veldhoven (NL)

(72) Inventors: Alessandro Polo, Arendonk (BE); Nitesh Pandey, Eindhoven (NL); Armand Eugene Albert Koolen, Nuth (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/941,324

(22) Filed: Mar. 30, 2018

(65) Prior Publication Data

US 2018/0292757 A1 Oct. 11, 2018

(30) Foreign Application Priority Data

Apr. 6, 2017 (EP) ..................................... 17165318

(51) Int. Cl.
*G03F 7/20* (2006.01)
*G01N 21/47* (2006.01)
(Continued)

(52) U.S. Cl.
CPC .......... *G03F 7/70616* (2013.01); *G01B 11/02* (2013.01); *G01B 11/14* (2013.01);
(Continued)

(58) Field of Classification Search
CPC ........... G01N 21/4788; G01N 21/9501; G01N 21/956; G01N 21/211; G01N 21/25;
(Continued)

(56) References Cited

U.S. PATENT DOCUMENTS 4,707,056 A * 11/1987 Bittner .................. G01J 3/0259
351/159.52
5,615,673 A * 4/1997 Berger ............... A61B 5/14532
356/301
(Continued)

OTHER PUBLICATIONS

Prieto-Blanco, X. et al., "Analytical design of an Offner imaging spectrometer," 2006, Optics Express, vol. 14, No. 20, pp. 9156-9168. (Year: 2006).*
(Continued)

*Primary Examiner* — Gordon J Stock, Jr.
(74) *Attorney, Agent, or Firm* — Sterne, Kessler, Goldstein & Fox P.L.L.C.

(57) ABSTRACT

A radiation receiving system for an inspection apparatus, used to perform measurements on target structures on lithographic substrates as part of a lithographic process, comprises a spectrometer with a number of inputs. The radiation receiving system comprises: a plurality of inputs, each input being arranged to provide radiation from a target structure; a first optical element operable to receive radiation from each of the plurality of inputs; a second optical element operable to receive radiation from the first optical element and to scatter the radiation; and a third optical element operable to direct the scattered radiation onto a detector. The second optical element may for example be a reflective diffraction grating that diffracts incoming radiation into an output radiation spectrum.

20 Claims, 7 Drawing Sheets

(51) Int. Cl.
  *G01B 11/14* (2006.01)
  *G01J 3/04* (2006.01)
  *G01B 11/02* (2006.01)
  *G01J 3/02* (2006.01)
  *G01N 21/95* (2006.01)
(52) U.S. Cl.
  CPC ............... *G01J 3/0218* (2013.01); *G01J 3/04* (2013.01); *G01N 21/47* (2013.01); *G01N 21/4788* (2013.01); *G03F 7/70625* (2013.01); *G03F 7/70633* (2013.01); *G01N 21/9501* (2013.01)
(58) Field of Classification Search
  CPC .... G01N 21/251; G01N 21/255; G01N 21/29; G01N 21/31; G01N 21/47; G01N 21/55; G01N 21/74; G01N 2021/213; G01N 2021/214; G01N 2021/3711; G01N 2021/4711; G01N 21/8422; G01N 2021/4719; G01N 2021/4741; G01N 2021/4745; G01N 2021/4747; G01N 2021/475; G01N 2021/4752; G03F 7/70625; G03F 7/70633; G03F 7/7065; G03F 7/70616; G02B 6/2931; G02B 6/29313; G02B 6/29314; G01J 3/0202; G01J 3/021; G01J 3/0237; G01J 3/0262; G01J 3/027; G01J 3/0286; G01J 3/0297; G01J 3/06; G01J 3/12; G01J 3/18; G01J 3/28; G01J 3/2803; G01J 3/2823; G01J 3/46; G01J 3/50; G01J 2003/061; G01J 2003/062; G01J 2003/063; G01J 2003/066; G01J 2003/069; G01J 2003/1282; G01J 2003/2813; G01J 2003/2826; G01J 2003/283; G01J 2003/2833; G01J 2003/2836; G01J 2003/2843; G01J 2003/2866; G01J 2003/2869; G01J 2003/2873; G01J 2003/2883; G01J 3/0218; G01J 3/0221; G01J 3/0229; G01J 3/04; G01J 2003/1205; G01J 2003/1208; G01J 2003/1295; G01J 2003/1857
  See application file for complete search history.

(56) References Cited

U.S. PATENT DOCUMENTS

| | | | | |
|---|---|---|---|---|
| 5,880,834 | A * | 3/1999 | Chrisp | G01J 3/02 356/305 |
| 6,100,974 | A * | 8/2000 | Reininger | G01J 3/02 356/300 |
| 6,128,093 | A * | 10/2000 | Niikura | G01N 21/55 356/319 |
| 6,266,140 | B1 * | 7/2001 | Xiang | G01J 3/18 356/305 |
| 6,636,305 | B2 * | 10/2003 | Zhao | G01J 3/04 356/300 |
| 7,235,047 | B2 * | 6/2007 | MacAulay | G02B 21/0028 359/201.1 |
| 7,242,468 | B1 * | 7/2007 | Zhang | G01J 3/02 356/301 |
| 7,463,369 | B2 * | 12/2008 | Wack | G01B 11/24 356/364 |
| 7,609,370 | B2 * | 10/2009 | Voigt | G01J 3/02 356/301 |
| 7,629,591 | B2 * | 12/2009 | Nelson | G01J 3/2803 250/458.1 |
| 7,692,776 | B2 * | 4/2010 | Treado | G01J 3/02 356/301 |
| 7,969,568 | B2 * | 6/2011 | Holden | G01J 3/02 356/300 |
| 8,098,373 | B2 * | 1/2012 | Nelson | G01J 3/02 356/328 |
| 8,502,977 | B1 * | 8/2013 | Maleev | G01N 21/211 356/326 |
| 8,553,224 | B2 * | 10/2013 | Morrow | G02B 6/32 356/302 |
| 2003/0210392 | A1 * | 11/2003 | Vaez-Iravani | G01N 21/8806 356/237.2 |
| 2003/0227628 | A1 * | 12/2003 | Kreimer | G01J 3/02 356/419 |
| 2006/0038997 | A1 * | 2/2006 | Julian | G01J 3/02 356/328 |
| 2006/0066855 | A1 | 3/2006 | Boef et al. | |
| 2006/0124840 | A1 * | 6/2006 | Ida | G01J 3/02 250/226 |
| 2007/0296969 | A1 * | 12/2007 | Goldstein | G01J 3/02 356/328 |
| 2009/0040519 | A1 * | 2/2009 | Zhang | G01J 3/02 356/326 |
| 2009/0103088 | A1 * | 4/2009 | Delmas | G01J 3/02 356/328 |
| 2011/0102753 | A1 | 5/2011 | Van De Kerkhof et al. | |
| 2012/0044470 | A1 | 2/2012 | Smilde et al. | |
| 2013/0114070 | A1 * | 5/2013 | Gardner, Jr. | G01J 3/02 356/73 |
| 2013/0182250 | A1 * | 7/2013 | McClure | G01J 3/18 356/302 |
| 2014/0002819 | A1 * | 1/2014 | Kawata | G02B 21/0064 356/326 |
| 2014/0268104 | A1 * | 9/2014 | Treado | G01J 3/44 356/51 |
| 2014/0375981 | A1 * | 12/2014 | Wang | G01N 21/9501 356/51 |
| 2016/0252451 | A1 * | 9/2016 | Kawate | G01N 21/474 359/858 |
| 2017/0010153 | A1 | 1/2017 | Vezard et al. | |
| 2017/0097575 | A1 * | 4/2017 | Pandey | G01B 11/272 |

OTHER PUBLICATIONS

International Search Report and Written Opinion of the International Searching Authority directed to related International Patent Application No. PCT/EP2018/056357, dated Apr. 25, 2018; 16 pages.

Allington-Smith J. "Basic principles of integral field spectroscopy," New Astronomy Reviews, vol. 50, Apr. 19, 2006; pp. 244-251.

Appenzeller I. "Introduction to Astronomical Spectroscopy," Section 4.6 Multiobject Spectrometers through Section 4.8.2 Design Details, 2012; pp. 110-122.

"Spectroscopic diffraction based overlay measurements," Research Disclosure No. 620057, Nov. 20, 2015; 4 pages.

* cited by examiner

RADIATION RECEIVING SYSTEM

FIELD

The present invention relates to radiation receiving systems for inspection apparatuses.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Multiple layers, each having a particular pattern and material composition, are applied to define functional devices and interconnections of the finished product.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field.

Examples of known scatterometers often rely on provision of dedicated metrology targets. For example, a method may require a target in the form of a simple grating that is large enough that a measurement beam generates a spot that is smaller than the grating (i.e., the grating is underfilled). In so-called reconstruction methods, properties of the grating can be calculated by simulating interaction of scattered radiation with a mathematical model of the target structure. Parameters of the model are adjusted until the simulated interaction produces a diffraction pattern similar to that observed from the real target.

In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. These targets can be smaller than the illumination spot and may be surrounded by product structures on a wafer. Examples of dark field imaging metrology can be found in numerous published patent applications, such as for example US2011102753A1 and US20120044470A. Multiple gratings can be measured in one image, using a composite grating target. The known scatterometers tend to use light in the visible or near-IR wave range, which requires the grating to be much coarser than the actual product structures whose properties are actually of interest. Such product features may be defined using deep ultraviolet (DUV) or extreme ultraviolet (EUV) radiation having far shorter wavelengths. Unfortunately, such wavelengths are not normally available or usable for metrology. Product structures made for example of amorphous carbon may be opaque to radiation of shorter wavelength.

Typically, a number of wavelengths are to measure the metrology targets. Given the abundance of materials used in lithographic processes, it is necessary to use increasing numbers of wavelengths in order to ensure a sufficient quality of metrology measurements. However, using the methodologies described above, each of the wavelengths are measured sequentially. This increases the time required to perform metrology, thereby decreasing processing throughput which is undesirable.

Scatterometers utilizing spectroscopic methods has been proposed, however, known spectrometers are not capable of simultaneously accommodating sufficiently high spectral and spatial resolutions needed for scatterometry.

SUMMARY

In a first aspect of the invention, there is provided a radiation receiving system for receiving radiation scattered by a target structure, comprising:
  a plurality of inputs, each input being arranged to provide radiation from a target structure;
  a first optical element operable to receive radiation from each of the plurality of inputs;
  a second optical element operable to receive radiation from the first optical element and to scatter the radiation; and
  a third optical element operable to direct the scattered radiation onto a detector.

In a second aspect of the invention, there is provided a radiation detection system for detecting radiation scattered by a target structure, the optical detection system comprising:
  at least one detector; and
  a plurality of radiation receiving systems as set out above.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Before describing embodiments of the invention in detail, it is instructive to present an example environment in which embodiments of the present invention may be implemented.

Figure 1:
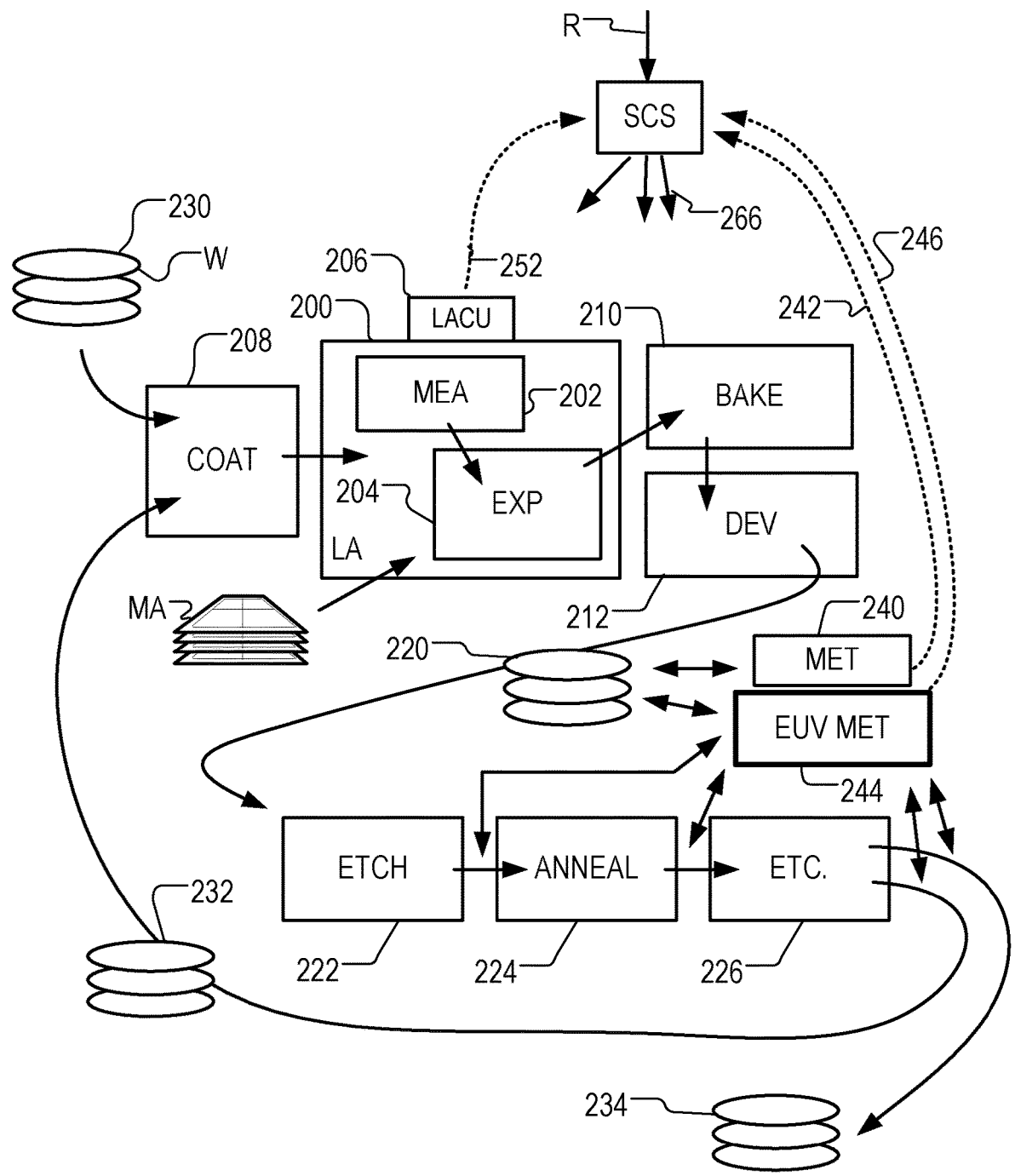
FIG. 1 depicts a lithographic apparatus together with other apparatuses forming a production facility for semiconductor devices.

FIG. 1 at 200 shows a lithographic apparatus LA as part of an industrial facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables WTa and WTb and two stations—an exposure station and a measurement station—between which the substrate tables can be exchanged.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth.

The apparatus 226 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system MET which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 240 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. As is also well known, the metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work. Of course, metrology apparatus 240 and/or other metrology apparatuses (not shown) can be applied to measure properties of the processed substrates 232, 234, and incoming substrates 230.

Figure 2A:
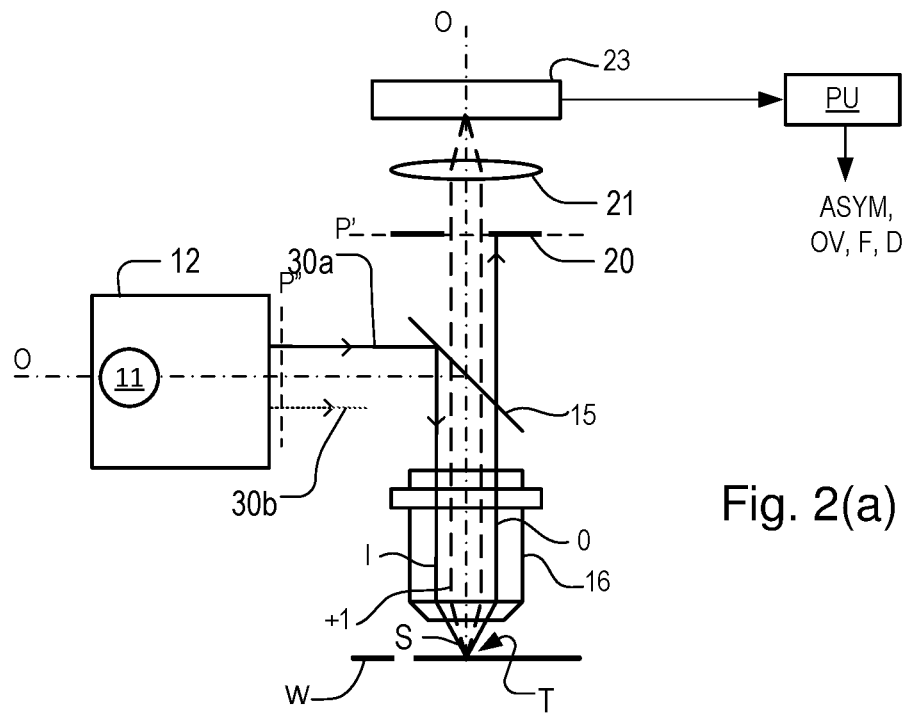
FIGS. 2(a) and 2(b) illustrates schematically an inspection apparatus adapted to perform known dark-field imaging inspection methods.

FIG. 2(a) shows schematically the key elements of an inspection apparatus implementing so-called dark field imaging metrology. The apparatus may be a stand-alone device or incorporated in either the lithographic apparatus LA, e.g., at the measurement station, or the lithographic cell LC. An optical axis, which has several branches throughout the apparatus, is represented by a dotted line O. A target grating structure T and diffracted rays are illustrated in more detail in FIG. 2(b).

As described in the prior applications cited in the introduction, the dark-filed-imaging apparatus of FIG. 2(a) may be part of a multi-purpose angle-resolved scatterometer that may be used instead of or in addition to a spectroscopic scatterometer. In this type of inspection apparatus, radiation emitted by a radiation source 11 is conditioned by an illumination system 12. For example, illumination system 12 may include a collimating lens system, a color filter, a polarizer and an aperture device. The conditioned radiation follows an illumination path, in which it is reflected by partially reflecting surface 15 and focused into a spot S on substrate W via a microscope objective lens 16. A metrology target T may be formed on substrate W. Lens 16, has a high numerical aperture (NA), preferably at least 0.9 and more preferably at least 0.95. Immersion fluid can be used to obtain with numerical apertures over 1 if desired. The multi-purpose scatterometer may have two or more measurement branches. Additionally, further optical systems and branches will be included in a practical apparatus, for example to collect reference radiation for intensity normalization, for coarse imaging of capture targets, for focusing and so forth. Details of these can be found in the prior publications mentioned above. For the purposes of the present disclosure, only the measurement branch of interest for the dark-filed imaging metrology is illustrated and described in detail.

In the collection path for dark-field imaging, imaging optical system 21 forms an image of the target on the substrate W on sensor 23 (e.g. a CCD or CMOS sensor). An aperture stop 20 is provided in a plane P' in the collection path. Plane P' is a plane conjugate to a pupil plane P (not shown) of objective lens 16. Aperture stop 20 may also be called a pupil stop. Aperture stop 20 can take different forms, just as the illumination aperture can take different forms. The aperture stop 20, in combination with the effective aperture of lens 16, determines what portion of the scattered radiation is used to produce the image on sensor 23. Typically, aperture stop 20 functions to block the zeroth order diffracted beam so that the image of the target formed on sensor 23 is formed only from the first order beam(s). In an example where both first order beams are combined to form an image, this would be the so-called dark field image, equivalent to dark-field microscopy. In the present application, however, only one of the first orders is imaged at a time, as explained below. The images captured by sensor 23 are output to image processor and controller PU, the function of which will depend on the particular type of measurements being performed. For the present purpose, measurements of asymmetry of the target structure are performed. Asymmetry measurements can be combined with knowledge of the target structures to obtain measurements of performance parameters of lithographic process used to form them. Performance parameters that can be measured in this way include for example overlay, focus and dose.

Where a metrology target T is provided on substrate W, this may be a 1-D grating, which is printed such that after development, the bars are formed of solid resist lines. The target may be a 2-D grating, which is printed such that after development, the grating is formed of solid resist pillars or vias in the resist. The bars, pillars or vias may alternatively be etched into the substrate. Each of these gratings is an example of a target structure whose properties may be investigated using the inspection apparatus.

The various components of illumination system 12 can be adjustable to implement different metrology 'recipes' within the same apparatus. In addition to selecting wavelength (color) and polarization as characteristics of the particular, illumination system 12 can be adjusted to implement different illumination profiles. Because plane P'' is conjugate with pupil plane P of objective lens 16 and the plane of the detector 19, an illumination profile in plane P'' defines the angular distribution of light incident on substrate W in spot S. To implement different illumination profiles, an aperture device can be provided in the illumination path. The aperture device may comprise different apertures mounted on a movable slide or wheel. It may alternatively comprise a programmable spatial light modulator. As a further alternative, optical fibers may be disposed at different location in the plane P'' and used selectively to deliver light or not deliver light at their respective locations. These variants are all discussed and exemplified in the documents cited above.

In a first example illumination mode, rays 30a are provided so that the angle of incidence is as shown at 'I' and the path of the zero order ray reflected by target T is labeled '0' (not to be confused with optical axis 'O'). In a second illumination mode, rays 30b can be provided, in which case the angles of incidence and reflection will be swapped. Both of these illumination modes will be recognized as off-axis illumination modes. Many different illumination modes can be implemented for different purposes.

Figure 2B:
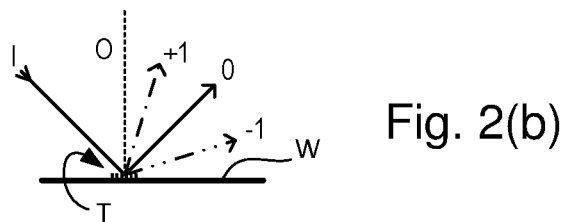

As shown in more detail in FIG. 2(b), target grating T as an example of a target structure is placed with substrate W normal to the optical axis O of objective lens 16. In the case of an off-axis illumination profile, a ray of illumination I impinging on grating T from an angle off the axis O gives rise to a zeroth order ray (solid line 0) and two first order rays (dot-chain line +1 and double dot-chain line −1). It should be remembered that with an overfilled small target grating, these rays are just one of many parallel rays covering the area of the substrate including metrology target grating T and other features. Since the beam of illuminating rays 30a has a finite width (necessary to admit a useful quantity of light), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown.

Referring also to FIG. 2(a), under the first illumination mode with rays 30a, +1 order diffracted rays from the target grating will enter the objective lens 16 and contribute to the image recorded at sensor 23. When the second illumination mode is used, rays 30b are incident at an angle opposite to rays 30b, and so the −1 order diffracted rays enter the objective and contribute to the image. Aperture stop 20 blocks the zeroth order radiation when using off-axis illumination. As described in the prior publications, illumination modes can be defined with off-axis illumination in X and Y directions.

By comparing images of the target grating under these different illumination modes, asymmetry measurements can be obtained. Alternatively, asymmetry measurements could be obtained by keeping the same illumination mode, but rotating the target. While off-axis illumination is shown, on-axis illumination of the targets may instead be used and a modified, off-axis aperture 20 could be used to pass substantially only one first order of diffracted light to the sensor. In a further example, prisms are used in place of aperture stop 20 which have the effect of diverting the +1 and −1 orders to different locations on sensor 23 so that they can be detected and compared without the need for two sequential image capture steps. This technique, is disclosed in the above-mentioned published patent application US2011102753A1, the contents of which are hereby incorporated by reference. 2nd, 3rd and higher order beams (not shown in FIG. 2) can be used in measurements, instead of or in addition to the first order beams. As a further variation, the off-axis illumination mode can be kept constant, while the target itself is rotated 180 degrees beneath objective lens 16 to capture images using the opposite diffraction orders.

Figure 3:
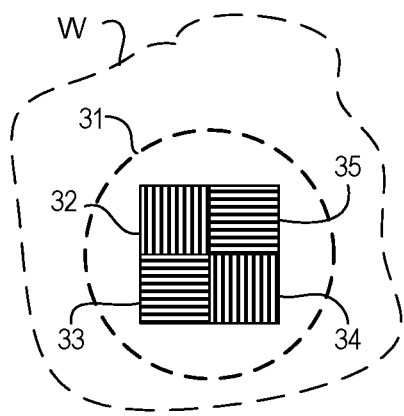
FIG. 3 illustrates a composite metrology target including a number of individual target gratings.

FIG. 3 depicts a composite target formed on a substrate W according to known practice. The composite target comprises four gratings 32 to 35 positioned closely together so that they will all be within the measurement spot S formed by the illumination beam of the metrology apparatus. A circle 31 indicates the extent of spot S on the substrate W. The four targets thus are all simultaneously illuminated and simultaneously imaged on sensor 23. In an example dedicated to overlay measurement, gratings 32 to 35 are themselves composite gratings formed by overlying gratings that are patterned in different layers of the semi-conductor device formed on substrate W. Gratings 32 to 35 may have differently biased overlay offsets in order to facilitate measurement of overlay between the layers in which the different parts of the composite gratings are formed. Gratings 32 to 35 may also differ in their orientation, as shown, so as to diffract incoming radiation in X and Y directions. In one example, gratings 32 and 34 are X-direction gratings with biases of the +d, −d, respectively. This means that grating 32 has its overlying components arranged so that if they were both printed exactly at their nominal locations one of the components would be offset relative to the other by a distance d. Grating 34 has its components arranged so that if perfectly printed there would be an offset of d but in the opposite direction to the first grating and so on. Gratings 33 and 35 are Y-direction gratings with offsets +d and −d respectively. Separate images of these gratings can be identified in the image captured by sensor 23. While four gratings are illustrated, another embodiment might require a larger matrix to obtain the desired accuracy.

Figure 4:
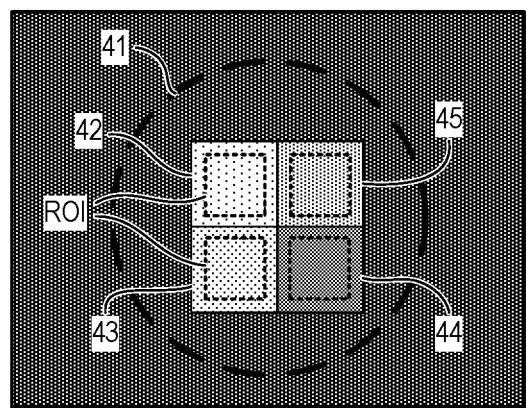
FIG. 4 illustrates an image of the target of FIG. 3, captured by the apparatus of FIG. 2.

FIG. 4 shows an example of an image that may be formed on and detected by the sensor 23, using the target of FIG. 3 in the apparatus of FIG. 2(a), and using an illumination profile providing off-axis illumination in both X and Y orientations simultaneously. The dark rectangle 40 represents the field of the image on the sensor, within which the illuminated spot 31 on the substrate is imaged into a corresponding circular area 41. Within this, rectangular areas 42-45 represent the images of the small target gratings 32 to 35. If the gratings are located in product areas, product features may also be visible in the periphery of this image field. Image processor and controller PU processes these images using pattern recognition to identify the separate images 42 to 45 of gratings 32 to 35. In this way, the images do not have to be aligned very precisely at a specific location within the sensor frame, which greatly improves throughput of the measuring apparatus as a whole. However the need for accurate alignment remains if the imaging process is subject to non-uniformities across the image field. In one embodiment of the invention, four positions P1 to P4 are identified and the gratings are aligned as much as possible with these known positions.

Once the separate images of the gratings have been identified, the intensities of those individual images can be measured, e.g., by averaging or summing selected pixel intensity values within the identified areas. Intensities and/or other properties of the images can be compared with one another to obtain measurements of asymmetry for the four or more gratings simultaneously. These results can be combined with knowledge of the target structures and bias schemes, to measure different parameters of the lithographic process. Overlay performance is an important example of such a parameter, and is a measure of the lateral alignment of two lithographic layers. Overlay can be defined more specifically, for example, as the lateral position difference between the center of the top of a bottom grating and the center of the bottom of a corresponding top-grating. To obtain measurements of other parameters of the lithographic process, different target designs can be used. Again, knowledge of the target designs and bias schemes can be combined with asymmetry measurements to obtain measurements of the desired performance parameter. Target designs are known, for example, for obtaining measurements of dose or focus from asymmetry measurements obtained in this way.

Typically, measurements performed in inspection apparatuses such as the one shown in FIG. 2 are performed using a plurality of wavelengths. This is due to the increasing number of layers and types of materials being deposited on substrates. Some semiconductor materials may be partially or entirely opaque at certain wavelengths, therefore requiring use of a plurality of wavelengths to ensure that the measurements are of a sufficient quality. However, as the number of layers increases, it becomes increasingly difficult to detect any buried alignment or measurement marks or targets. This, in turn, may require a further increase in the number of required wavelengths being used in measurements.

Using commonly known methods, such as the inspection apparatus of FIG. 2, each of the plurality of wavelengths is typically measured in a sequential fashion. The total measurement time is therefore directly proportional to the number of wavelengths employed. As the measurement time directly affects the production throughput of a lithographic system, it is desirable to minimize the amount of time used to perform the measurements.

To reduce measurement time, it has been realized that it is possible to carry out a number measurements simultaneously by using a radiation receiving system comprising a spectrometer to receive radiation from the target structure rather than the known arrangement shown in FIG. 2.

Figure 5:
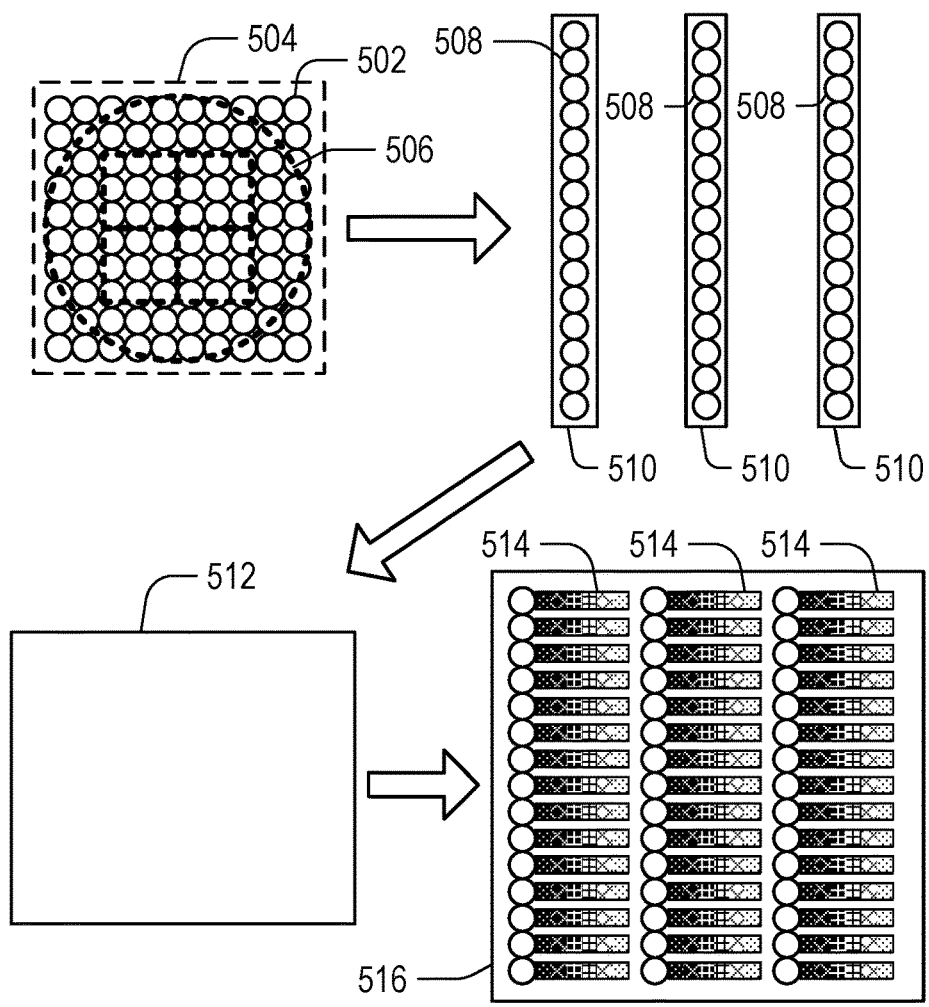
FIG. 5 is a schematic diagram of a radiation receiving system usable in the apparatus of FIG. 2.
Figure 6:
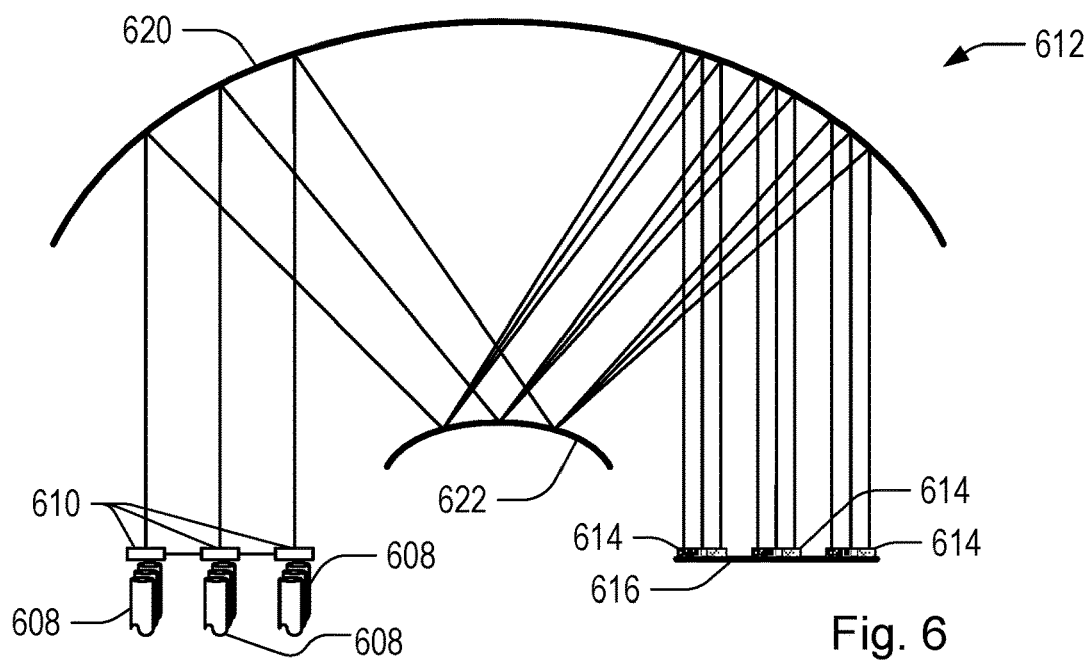
FIG. 6 illustrates a first examples of a known usable in the radiation receiving system of FIG. 5.

FIGS. 5 and 6 illustrates an implementation of a radiation receiving system comprising a spectrometer used in an inspection apparatus to, for example, perform measurements on a target structure.

In the present example, a plurality of optical fibers have input ends 502 that are positioned so as to receive radiation from a target structure, for example a target such as shown in FIG. 3. The input ends of the optical fibers are, in the present example, arranged in an array 504 with a square configuration, but it will be appreciated that other configurations could equally well be used. An outline of the radiation 506 received from the target structure, as described in FIG. 4, is overlaid on the optical fiber array.

The output ends of the optical fibers are rearranged into one or more linear arrays 508,608 of optical fibers. The linear arrays are then coupled to a number of corresponding inputs 510, 610 of a spectrometer 512, 612. In effect, the optical fibers transfer radiation received at the input ends thereof to the spectrometer located at the output ends thereof. Typically, a spectrometer comprises a number of inputs, dependent on the specific type and characteristics of the spectrometer. It will be appreciated that any suitable number of linear arrays may, in principle, be provided to the inputs of the spectrometer. In some examples, a number of linear arrays corresponding to the number of inputs are provided. In some examples, the number of linear arrays provided is dependent on at least one characteristic of the incoming radiation and/or on at least one characteristic of one or more optical elements of the spectrometer. In yet other examples, the number of linear arrays provided is dependent on a specific property to be measured. For example, where it is desired to measure several orders of diffraction, individual diffraction orders must be separated when arriving at the detector.

In the spectrometer, each of the fiber inputs of the one or more linear arrays will result in a separate spectrum 514, 614 being formed, for example on the surface of a suitable detector 516, 616. In effect, each fiber input substantially acts as a point radiation source that is diffracted by the spectrometer in a well-defined fashion. Based on the received spectra, and on knowledge of the position of individual fiber inputs of the fiber array, an image of the received radiation can be assembled.

Turning specifically to FIG. 6, a schematic depiction of a known spectrometer used in the radiation receiving system is illustrated. The spectrometer comprises a first optical element 620 that receives radiation from an input 610 and reflects the radiation towards a second optical element 622. The second optical element is operable to scatter the radiation received from the first optical element and to direct the scattered radiation back towards the first optical element 620. The second optical element may scatter the radiation in any suitable fashion. In some examples, the second optical element comprises a diffraction grating that diffracts the incoming radiation in dependence on the wavelengths of the radiation. Typically, the second optical element will be operable to diffract the incoming radiation into a radiation spectrum, although it will be appreciated that a number of implementations may be envisaged. The scattered radiation is subsequently directed towards a detector 616. In the present example, the first optical surface and the second optical surface are both substantially spherical.

It will be appreciated that the spectrometer shown in FIG. 6 is purely for purposes of illustrating the principle of the radiation receiving system, and is as such not intended to be limiting in any way. Numerous specific implementations of known spectrometer types may be envisaged by the skilled person. For example, so-called "Offner" spectrometers have been proposed. Alternatively, so-called "Czerny-Turner" spectrometers have been proposed.

Known spectrometers, however, suffer from a number of disadvantages. In particular, known spectrometers are limited to a certain length and a maximum number of inputs. For example, the "Offner" spectrometer only accepts a single input. The "Czerny-Turner" spectrometer has a very limited "field of view" which limits the input length significantly. This places physical limitations on the maximum number of optical fibers that can be used, since each input can only accommodate a certain number of optical fibers. This, in turn, limits the maximum resolution that can be obtained during measurements.

Figure 7:
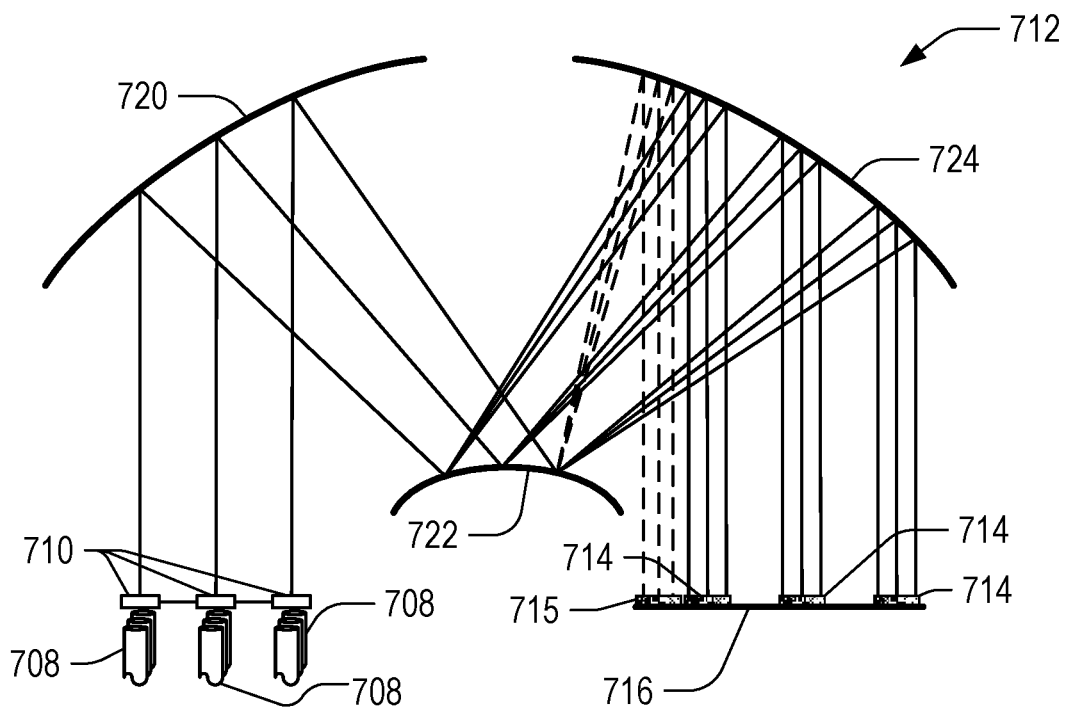
FIG. 7 shows an example of a spectrometer usable in the radiation receiving system of FIG. 5 according to an embodiment of the invention.

FIG. 7 illustrates an exemplary radiation detection system 712 for receiving radiation from a target structure in accordance with the present disclosure. For ease of comparison with FIG. 6, elements of FIG. 7 similar to corresponding elements of FIG. 6 are labelled with reference signs similar to those used in FIG. 6, but with prefix "7" instead of "6".

The radiation receiving system comprises: a plurality of inputs 710, each input being arranged to provide radiation from a target structure; a first optical element 720 operable to receive radiation from each of the plurality of inputs; a second optical element 722 operable to receive radiation from the first optical element and to scatter the radiation; and a third optical element 724 operable to direct the scattered radiation onto a detector 716. The second optical element may scatter the radiation in any suitable way. In an example, the second optical element comprises a reflective diffraction grating that diffracts incoming radiation into an output radiation spectrum.

Each of the first optical element, second optical element or third optical element may have an optical surface having any suitable shape. In some examples, at least one of the first optical element, second optical element or third optical element has a first surface shape. In a specific example, the first surface shape is a substantially toroidal shape. In other examples, the first surface shape is one of: spherical; paraboloid; cylindrical; or higher-order aspheric. In some examples, at least one of the first, second or third optical elements has an optical surface that is concentric with an optical surface of at least one other of the first, second or third optical elements.

In some examples, one or more of the optical surfaces of the first optical component, second optical component or third optical components has a modifiable geometry. This allows modification and tuning of the spectrometer, for example to take into account changes in radiation parameters or characteristics or to correct for optical anomalies or errors (e.g. aberrations). Furthermore, in some examples, this allows the accommodation of a large "field of view". The modifiable geometry may be implemented in any suitable fashion. In some examples, the optical surface of the optical components may be directly modified so as to changes the geometry of the optical surface itself. In a specific example, the optical surface of the one or more of the first optical element, second optical element or third optical element may be a MEMS mirror. In another specific example, the optical surface of the one or more of the first optical element, second optical element or third optical element may be a membrane mirror. In other examples, the optical surface of one or more of the optical components may be modified by use of modifying elements (e.g. optical wedges or other transmissive elements).

The modifiable geometry may be modified in response to any suitable parameters or requirements. For example, the modifiable geometry may be adjusted in response to changes in the radiation spectrum, or to take into account specific characteristics of the target structures under measurement. In another example, the modifiable geometry may be adjusted to take into account known defects or optical artefacts of the inspection apparatus. Specifically, the modifiable geometry may be used to correct for or adjust, without limitation): spatial resolution; spectral resolution; spectral range; field of view of the spectrometer; and optical aberrations.

The modifiable geometry may be adjusted at any suitable intervals. In some examples, the modifiable geometry is adjusted only between substrate lots or batches. In other examples, the modifiable geometry is adjusted for each individual substrate under measurement. In yet other examples, the modifiable geometry is continuously adjusted, for example to correct for transient effects or optical artefacts (e.g. heating-induced effects in one or more of the optical components).

The radiation from the target structure may be delivered to the inputs in any suitable way. In the examples described above, the radiation is transmitted to the spectrometer from the target structure by way of one or more optical fibers. It will be appreciated that, although not shown in the Figures, additional or alternative optical components may be used to direct the radiation from the target structure to the radiation receiving system.

Figure 8:
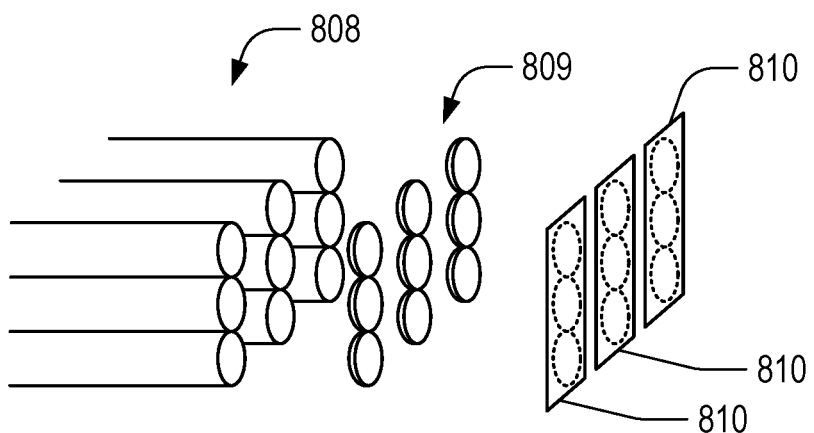
FIG. 8 illustrates an array of optical fibers delivering radiation to an input of a spectrometer.

FIG. 8 illustrates a first exemplary arrangement of optical fibers 808, in which a microlens 809 is positioned at the output end of each of the optical fibers. The microlenses allow the radiation beam to be adapted or modified prior to arriving at the input 810 of the radiation receiving system. In some examples, one or more of the microlenses may comprise an optical surface with a modifiable geometry. It will be appreciated that the microlenses shown in FIG. 8 are exemplary only and that alternative or additional optical beam-shaping components could equally well be used.

Figure 9A:
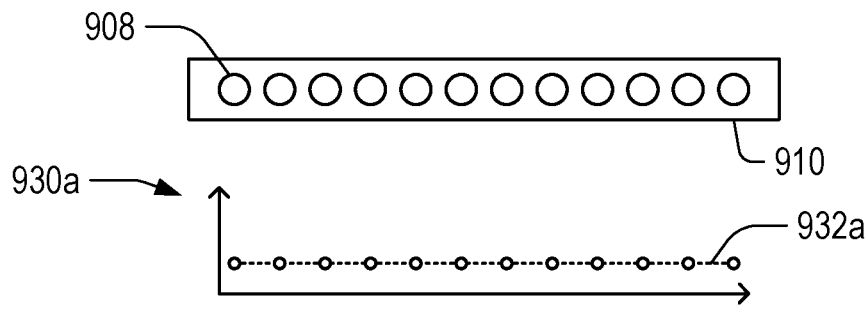
FIGS. 9(a)-9(c) shows a number of exemplary optical fiber configurations.

In the examples discussed above, linear fiber arrays have been used as input for the radiation receiving system, each array comprising a plurality of fibers. A typical situation is illustrated in FIG. 9(a), which shows a plurality of optical fibers 908 arranged in a linear configuration at an input 910 of the radiation receiving system. Each optical fiber is spaced equidistantly between the two neighboring optical fibers (as illustrated in the graph 930a, which indicates the spacing 932a between adjacent optical fibers). Typically, in order to accommodate the highest number of optical fibers at a given input, the optical fibers may be arranged at closely as possible at the input. In most situations, this arrangement may be preferable, since it ensures the highest number of optical fibers available to provide radiation to a particular input of the spectrometer.

However, there may be circumstances in which a simple linear configuration is undesirable or disadvantageous. For example, a closely packed configuration of optical fibers may increase the risk of crosstalk effects between the optical fibers. To mitigate or counter such effects, the plurality of optical fibers of at least one of the plurality of slits may in some examples be distributed along the length of the at least one slit according to a distribution function.

Figure 9B:
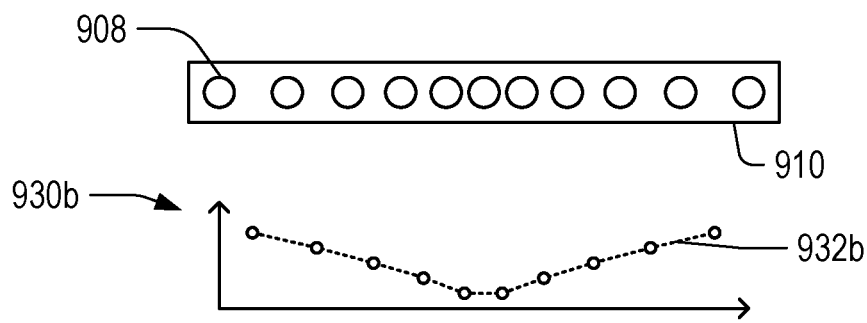

In the example shown in FIG. 9(b), the optical fibers 908 are distributed according to a distribution function (as shown in the graph 930a, which indicates the spacing 932b between adjacent optical fibers). In the present example, the distribution function is chosen such that the spacing between neighboring optical fibers increases linearly as the distance of the optical fibers increases from the center of the configuration. It will be appreciated that other distribution functions could, in principle, be implemented.

Figure 9C:
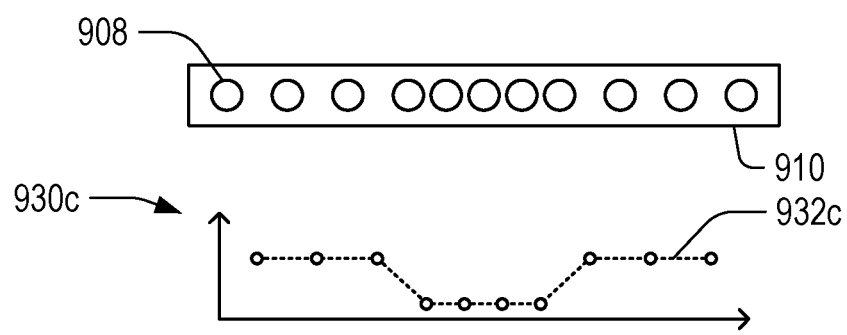

FIG. 9(c) illustrates another example, in which a first portion of the optical fibers are spaced at a first distance from neighboring optical fibers, and a second portion of the optical fibers is spaced at a second distance from neighboring optical fibers (as shown in the graph 930c, which indicates the spacing 932c between adjacent optical fibers).

In the examples described above, the radiation receiving system has comprised a single spectrometer. In some circumstances, however, it may be desirable or advantageous to utilize a plurality of spectrometers operating in unison.

A first exemplary optical system 1000 comprising a first radiation receiving system 1012a and a second radiation receiving system 1012b will now be discussed with reference to FIGS. 10(a)-10(c). For ease of comparison with FIG. 7, elements of FIG. 10 similar to corresponding elements of FIG. 7 are labelled with reference signs similar to those used in FIG. 7, but with prefix "10" instead of "7". Both of the first radiation receiving system and the second radiation receiving system are substantially identical to the radiation receiving system shown in FIG. 7. It will be appreciated, however, that a plurality of specific implementations may be envisaged. Some of such implementations may comprise some or all of the features of the examples shown in any of FIGS. 7-9.

Figure 10A:
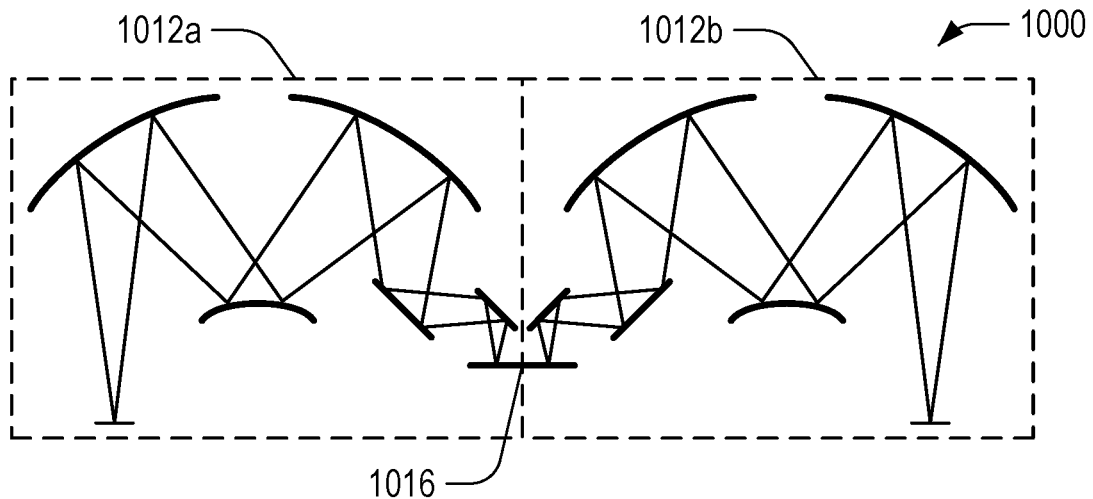
FIGS. 10(a)-10(c) illustrates a first exemplary optical system comprising a plurality of spectrometers.

In the example shown in FIG. 10(a), the first radiation receiving system and the second radiation receiving system are arranged so as to provide radiation to a shared detector 1016. In particular, each of the radiation receiving systems provides radiation to a separate part of the detector. There are a number of possible ways and implementations in which this may be advantageously utilized, two of which will now be described.

Figure 10B:
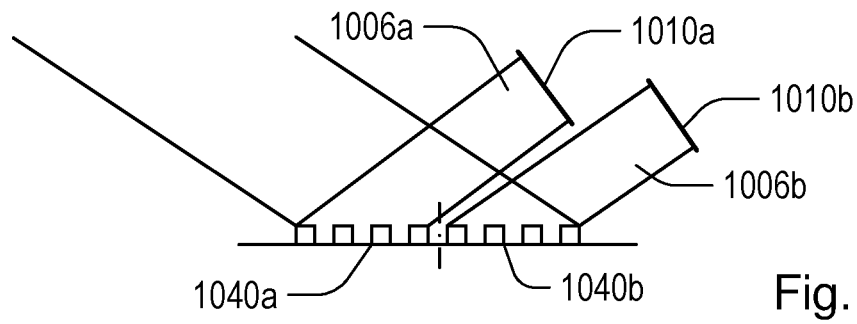

FIG. 10(b) illustrates a first exemplary implementation, in which the inputs 1010a of the first radiation receiving system is arranged so as to receive radiation 1006a from a first portion 1040a of a target structure, and in which the inputs 1010b of the second radiation receiving system is arranged to receive radiation 1006b from a second portion 1040b of a target structure. Such an arrangement allows imaging of target structures or target areas on a substrate that cannot be imaged in its entirety by using only a single detector.

Figure 10C:
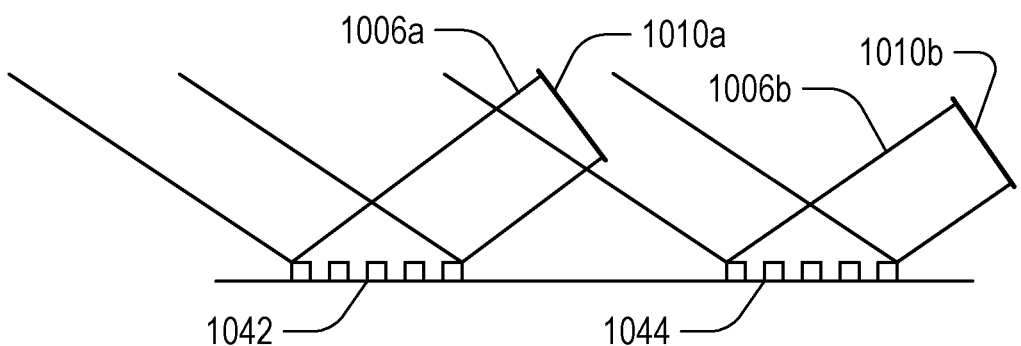

FIG. 10(c) illustrates a second exemplary implementation, in which the inputs 1010a of the first radiation receiving system is arranged so as to receive radiation 1006a from a first target structure 1042, and in which the inputs 1010b of the second radiation receiving system is arranged to receive radiation 1006b from a second target structure 1044. Such an arrangement allows simultaneous measurement of a plurality of target structures or areas. This reduces the overall time required by the measurement step, which increases the overall throughput of the lithographic system.

Figure 11:
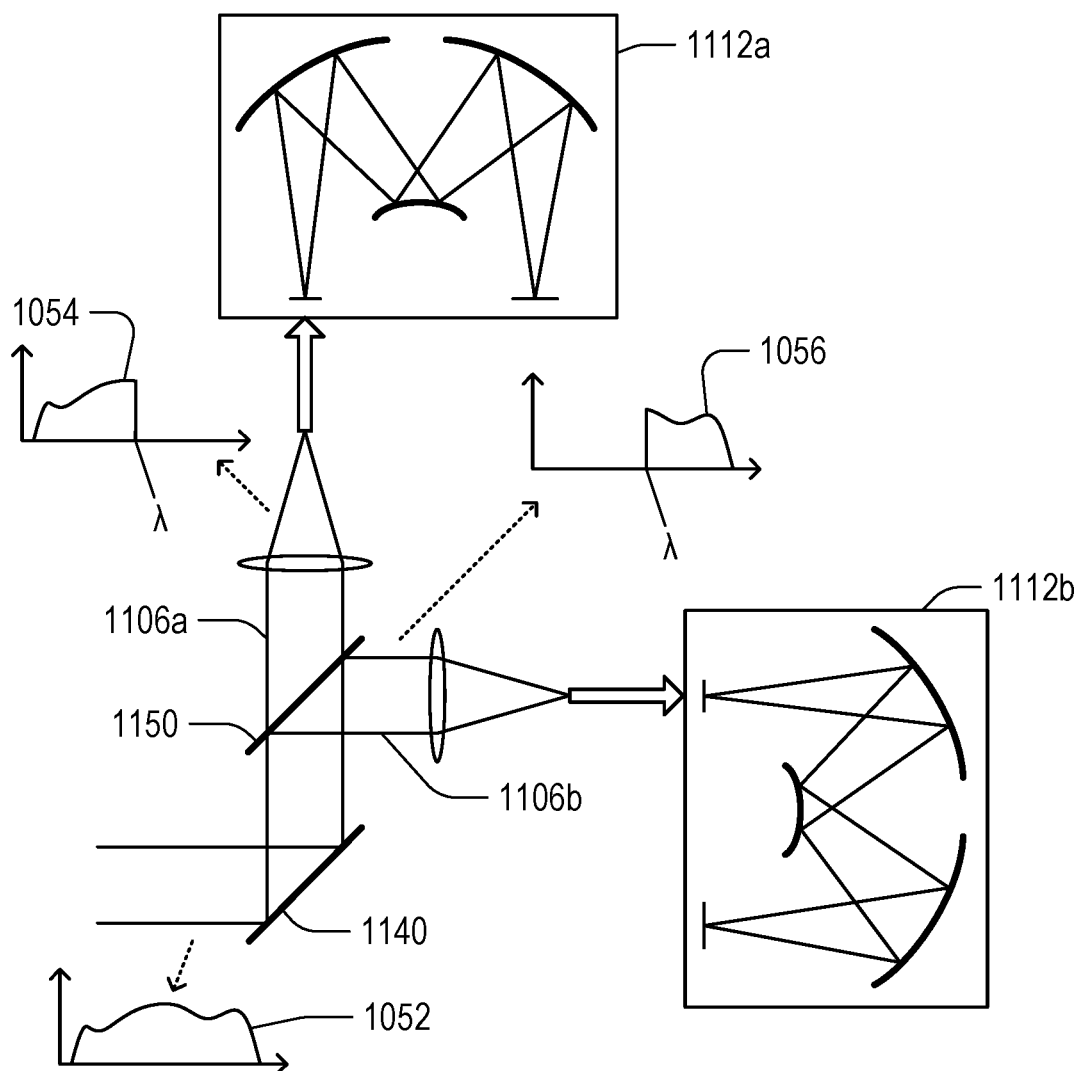
FIG. 11 illustrates a second exemplary optical system comprising a plurality of spectrometers.

A second exemplary optical system comprising a plurality of spectrometers is shown in FIG. 11. For ease of comparison with FIG. 7, elements of FIG. 11 similar to corresponding elements of FIG. 7 are labelled with reference signs similar to those used in FIG. 7, but with prefix "11" instead of "7".

In this example, radiation is received from a target structure 1140 (or other target area) on the surface of a substrate. The received radiation is received by an optical splitter 1150 operable to split the radiation into a first portion 1106a and a second portion 1106b. Subsequently, the first portion is received by a first radiation receiving system 1112a, and the second portion is received by a second radiation receiving system 1112b.

The optical splitter may take any suitable form and may be implemented in any suitable fashion. In an example, the optical splitter comprises a dichroic mirror. The dichroic mirror is operable to divide an input spectrum 1052 into a first portion 1054 and a second portion 1056. In some examples, the dichroic mirror transmits radiation having a wavelength below a particular threshold wavelength k, and reflects radiation having a wavelength above the threshold wavelength. In other examples, the dichroic mirror transmits all wavelengths above the threshold wavelength and reflects wavelengths below the threshold wavelength.

By splitting the received radiation into a plurality of radiation components based on one or more characteristics of the radiation, the measurement process may be improved (e.g. improving accuracy of the measurement results) or a plurality of specific parameters may be evaluated.

Although only two radiation receiving systems are shown in the two foregoing examples, it will be realized that this is for exemplary and conciseness purposes only. In principle, any suitable number of radiation receiving systems, along with an appropriate number of corresponding additional optical components, may be used.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A radiation receiving system for receiving radiation scattered by a target structure, the radiation receiving system comprising:
   a plurality of optical fibers configured to guide radiation;
   a plurality of inputs configured, during operation, to receive the plurality of optical fibers and the guided radiation, wherein each of the plurality of inputs comprises a slit configured to receive a group of optical fibers, from the plurality of optical fibers, distributed according to substantially a bell curve distribution along a length of the slit;
   a first optical element configured to receive radiation from the plurality of inputs;
   a second optical element configured to receive and scatter radiation from the first optical element; and
   a third optical element configured to direct radiation from the second optical element onto a detector,
   wherein at least one of the first, second, and third optical elements comprises an optical surface having a substantially toroidal shape or a modifiable geometry.

2. The radiation receiving system of claim 1, wherein at least one of the first, second, and third optical elements comprises an optical surface that is concentric with an optical surface of at least one other of the first, second, and third optical elements.

3. The radiation receiving system of claim 1, wherein each fiber of the plurality of optical fibers comprises a microlens.

4. The radiation receiving system of claim 1, wherein each of the first, second, and third optical elements comprises an optical surface having at least one of a substantially toroidal shape and a modifiable geometry.

5. A radiation detection system for detecting radiation scattered by a target structure, the radiation detection system comprising:
   a detector; and
   first and second radiation receiving systems, each of the first and second radiation receiving systems comprising:
      a plurality of optical fibers configured to guide the radiation scattered by the target structure;
      a plurality of inputs configured, during operation, to receive the plurality of optical fibers and the guided radiation, wherein each of the plurality of inputs comprises a slit configured to receive a group of optical fibers, from the plurality of optical fibers, distributed according to substantially a bell curve distribution along a length of the slit;
      a first optical element configured to receive radiation from the plurality of inputs;
      a second optical element configured to receive and scatter radiation from the first optical element; and
      a third optical element configured to direct radiation from the second optical element onto the detector.

6. The radiation detection system of claim 5, wherein:
   the detector comprises first and second detector devices;
   the first radiation receiving system is configured to direct radiation received by the first radiation receiving system onto the first detector device; and
   the second radiation receiving system is configured to direct radiation received by the second radiation receiving system onto the second detector device.

7. The radiation detection system of claim 5, further comprising an optical splitter configured to split the radiation scattered by the target structure, wherein the first radiation receiving system is configured to receive a first portion of the split radiation and the second radiation receiving system is configured to receive a second portion of the split radiation.

8. A metrology system comprising:
   a radiation source configured to generate radiation;
   an optical element configured to direct the radiation toward a target structure;
   a first radiation receiving system comprising:
      a plurality of optical fibers configured to guide radiation scattered by the target structure;
      a plurality of inputs configured, during operation, to receive the plurality of optical fibers and the guided radiation, wherein each of the plurality of inputs comprises a slit configured to receive a group of optical fibers, from the plurality of optical fibers, distributed according to substantially a bell curve distribution along a length of the slit;
      a first optical element configured to receive radiation from the plurality of inputs;
      a second optical element configured to receive and scatter radiation from the first optical element; and
      a third optical element configured to direct radiation from the second optical element onto a detector.

9. The metrology system of claim 8, further comprising a second radiation receiving system comprising:
   a plurality of optical fibers configured to guide radiation scattered by the target structure or another target structure;
   a plurality of inputs configured, during operation, to receive the plurality of optical fibers of the second radiation receiving system and radiation guided by the plurality of optical fibers of the second radiation receiving system;
   a first optical element configured to receive radiation from the plurality of inputs of the second radiation receiving system;
   a second optical element configured to receive and scatter radiation from the first optical element of the second radiation receiving system; and
   a third optical element configured to direct radiation from the second optical element of the second radiation receiving system onto the detector.

10. The metrology system of claim 9, wherein the metrology system further comprises an optical splitter configured to split the radiation scattered by the target structure, wherein the first radiation receiving system is configured to receive a first portion of the split radiation and the second radiation receiving system is configured to receive a second portion of the split radiation.

11. The metrology system of claim 10, wherein the first portion of the split radiation comprises a first spectrum and the second portion of the split radiation comprises a second spectrum that is substantially different from the first spectrum.

12. A metrology system comprising:
   a radiation source configured to generate radiation;
   an optical element configured to direct the radiation toward a target structure;
   a radiation receiving system comprising:
      a plurality of inputs configured to receive radiation diffracted by the target structure;
      a first optical element configured to receive radiation from the plurality of inputs;

a second optical element configured to receive and scatter radiation from the first optical element;

a detector; and a third optical element configured to direct radiation from the second optical element onto the detector, wherein the metrology system is configured to generate dark field detection results based on radiation received by the detector.

13. The metrology system of claim 12, wherein the detector is configured to receive at least a first diffraction order of the diffracted radiation.

14. The metrology system of claim 12, wherein the metrology system comprises an aperture structure configured to block a zeroth diffraction order of the diffracted radiation.

15. The metrology system of claim 12, wherein the metrology system is further configured to determine an overlay difference between two layers generated by lithographic processes of the target.

16. The metrology system of claim 12, wherein at least one of the first, second, and third optical elements comprises an optical surface having a substantially toroidal shape or a modifiable geometry.

17. The metrology system of claim 12, wherein at least one of the first, second, and third optical elements comprises an optical surface that is concentric with an optical surface of at least one other of the first, second, and third optical elements.

18. The metrology system of claim 12, wherein the radiation receiving system further comprises a plurality of optical fibers configured to guide the input radiation to the plurality of inputs, wherein the plurality of inputs are further configured to receive the plurality of optical fibers.

19. The metrology system of claim 18, wherein each fiber of the plurality of optical fibers comprises a microlens.

20. The metrology system of claim 18, wherein each of the plurality of inputs comprises a slit configured to receive a group of optical fibers, from the plurality of optical fibers, distributed evenly or according to a bell curve distribution along a length of the slit.

* * * * *